US012658912B2

(12) United States Patent
Cho et al.

(10) Patent No.: US 12,658,912 B2
(45) Date of Patent: Jun. 16, 2026

(54) INRUSH CURRENT LIMITER AND SYSTEM INCLUDING THE SAME

(71) Applicant: SAMSUNG SDI CO., LTD., Yongin-si (KR)

(72) Inventors: Kyusung Cho, Yongin-si (KR); Giho Seo, Yongin-si (KR); Yujeong Jeon, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 109 days.

(21) Appl. No.: 18/485,764

(22) Filed: Oct. 12, 2023

(65) Prior Publication Data

US 2024/0186995 A1 Jun. 6, 2024

(30) Foreign Application Priority Data

Dec. 1, 2022 (KR) ......................... 10-2022-0166038

(51) Int. Cl.
*H03K 17/00* (2006.01)
*H03K 17/06* (2006.01)
(Continued)

(52) U.S. Cl.
CPC ....... *H03K 17/0828* (2013.01); *H03K 17/063* (2013.01); *H03K 17/567* (2013.01)

(58) Field of Classification Search
CPC .......... H02H 9/025; H02H 9/001; H02H 9/04; H02H 9/02; H03K 17/0828; H03K 17/063; H03K 17/567; H03K 17/687
See application file for complete search history.

(56) References Cited

U.S. PATENT DOCUMENTS 4,901,184 A 2/1990 Ishii et al.
6,335,654 B1 * 1/2002 Cole ........................ G05F 1/565
323/299
(Continued)

FOREIGN PATENT DOCUMENTS

JP 64-45440 U 3/1989
JP 9-120316 A 5/1997
(Continued)

OTHER PUBLICATIONS

EPO Extended European Search Report dated Apr. 22, 2024, issued in corresponding European Patent Application No. 23203287.0, 8 pages.
(Continued)

*Primary Examiner* — Tuan T Lam
(74) *Attorney, Agent, or Firm* — Womble Bond Dickinson (US) LLP

(57) ABSTRACT

An inrush current limiter includes: first and second input nodes receiving an input voltage from a power source; first and second output nodes connected to a load; a field effect transistor connected between the first input node and the first output node; a gate driver comprising a first voltage divider circuit comprising a first resistor connected between the first input node and a control terminal of the field effect transistor and a second resistor connected between the control terminal of the field effect transistor and the second input node, and a first capacitor connected between the first input node and the control terminal of the field effect transistor, and adjusting a time until the field effect transistor is turned-on after the input voltage is input; and a high voltage limiter comprising a third resistor connected in parallel with the first resistor and having variable a resistance value.

13 Claims, 6 Drawing Sheets

(51) Int. Cl.
    *H03K 17/082*      (2006.01)
    *H03K 17/567*      (2006.01)

(56)             References Cited

U.S. PATENT DOCUMENTS

| | | | | |
|---|---|---|---|---|
| 7,408,755 | B1 * | 8/2008 | Ye | H02H 3/025 |
| | | | | 361/93.7 |
| 7,715,163 | B2 * | 5/2010 | Lee | H02H 9/001 |
| | | | | 361/57 |
| 2010/0284116 | A1 | 11/2010 | Yoshizawa | |
| 2011/0204929 | A1 | 8/2011 | Nakayama et al. | |
| 2014/0292219 | A1 * | 10/2014 | Suzuki | H05B 45/3725 |
| | | | | 363/49 |
| 2016/0156302 | A1 | 6/2016 | Asai | |
| 2018/0175611 | A1 | 6/2018 | Okamoto | |
| 2021/0075312 | A1 | 3/2021 | Yoshida et al. | |
| 2021/0376596 | A1 | 12/2021 | Kim et al. | |

FOREIGN PATENT DOCUMENTS

| | | | |
|---|---|---|---|
| JP | 2001-333580 | A | 11/2001 |
| JP | 2005-45957 | A | 2/2005 |
| JP | 2014-117062 | A | 6/2014 |
| JP | 2018-102021 | A | 6/2018 |
| JP | 2019-205286 | A | 11/2019 |
| KR | 10-1147257 | B1 | 5/2012 |
| KR | 10-2021-0147335 | A | 12/2021 |
| WO | 2010/021082 | A1 | 2/2010 |

OTHER PUBLICATIONS

Nobuo, F., "Analog Electronic Circuits in the Era of Integrated Circuits," Japan, Shokodo Co., Ltd., Mar. 15, 1984, pp. 134-137, English translation of the parts relating to FIG. 6.21(a) and FIG. 6.23(b).
Japanese Office Action dated Nov. 5, 2024, issued in corresponding Japanese Patent Application No. 2023-177580 (7 pages).

* cited by examiner

<u>10</u>

INRUSH CURRENT LIMITER AND SYSTEM INCLUDING THE SAME

CROSS-REFERENCE TO RELATED APPLICATION

The present application claims priority to and the benefit of Korean Patent Application No. 10-2022-0166038 filed in the Korean Intellectual Property Office on Dec. 1, 2022, the entire content of which is incorporated herein by reference.

BACKGROUND

1. Field

Aspects of some embodiments of the present disclosure relate to an inrush current limiter and a system including the same.

2. Description of the Related Art

An inrush current is a transient phenomenon that additionally occurs according to the size of a load when an input voltage is applied in an electric/electronic system. Such an inrush current may cause permanent damage, fault, or abnormal operation of the system, and thus may desirably be limited. In general, a battery management system (BMS) applied to a battery pack may also apply a technology for limiting inrush current.

An inrush current limiting circuit in which a field effect transistor (FET) having a low on-resistance is used as a main switch for limiting an inrush current may enable maintaining a low voltage drop after blocking the inrush current. However, due to characteristics of the FET, in order to have a low on-resistance, the gate-source voltage may be maintained at, for example, 10V or more, and the voltage between the gate-source terminals may not exceed a maximum of, for example, 20V for safe control of the FET. As such, due to the low voltage range of the FET, it may be difficult to safely control the FET, which is the main switch, when the inrush current limiting circuit is applied to a battery system having a wide supply voltage range.

The above information disclosed in this Background section is only for enhancement of understanding of the background and therefore the information discussed in this Background section does not necessarily constitute prior art.

SUMMARY

Aspects of some embodiments of the present disclosure include an inrush current limiter and a system including the same having a wide input voltage range.

According to some embodiments of the present disclosure, an inrush current limiter includes first and second input nodes receiving an input voltage from a power source, first and second output nodes connected to a load, a field effect transistor connected between the first input node and the first output node, a gate driver including a first voltage divider circuit composed of a first resistor connected between the first input node and a control terminal of the field effect transistor and a second resistor connected between the control terminal of the field effect transistor and the second input node, and a first capacitor connected between the first input node and the control terminal of the field effect transistor, and configured to adjust a time until the field effect transistor may be turned-on after the input voltage may be input, and a high voltage limiter including a third resistor connected in parallel with the first resistor and having a resistance value varied according to a voltage between the first input node and the control terminal of the field effect transistor, and configured to limit a voltage rise between the first input node and the control terminal of the field effect transistor by varying resistance value of the third resistor.

According to some embodiments, the high voltage limiter may include a first transistor connected between the first input node and the control terminal of the field effect transistor, and a second voltage divider circuit configured to vary voltage applied to a control terminal of the first transistor according to the voltage between the first input node and the control terminal of the field effect transistor. The third resistor may be an on-resistance of the first transistor.

According to some embodiments, the second voltage divider circuit may include a fourth resistor connected between the first input node and the control terminal of the first transistor, and a fifth resistor connected between the control terminal of the first transistor and the control terminal of the field effect transistor.

According to some embodiments, the second voltage divider circuit may further include a sixth resistor connected to the control terminal of the field effect transistor. The first resistor, the second resistor, the first capacitor, and the first transistor may be connected to the control terminal of the field effect transistor through the sixth resistor According to some embodiments, the first transistor may be an PNP transistor including an emitter terminal connected to the first input node, a collector terminal connected to the control terminal of the field effect transistor, and a base terminal operating as the control terminal of the first transistor.

According to some embodiments, an inrush current limiter may further include a low voltage releaser in which the first voltage divider circuit increases a voltage distribution ratio corresponding to the first resistor based on the input voltage becoming lower than a preset value.

According to some embodiments, the low voltage releaser may include a second transistor connected in parallel with the second resistor, and a control circuit configured to turn on the second transistor based on the input voltage becoming lower than the preset value.

According to some embodiments, the control circuit may include a third transistor connected between a control terminal of the second transistor and the second input node, and a Zener diode that may be connected between the first input node and a control terminal of the third transistor and conducts based on the input voltage exceeding the preset value. The third transistor may be turned on based on the Zener diode conducting. The second transistor may be turned-on based on the third transistor being turned off.

According to some embodiments, the control circuit may further include a seventh resistor connected between the first input node and the third transistor, an eighth resistor connected between the third transistor and the control terminal of the second transistor, and a ninth resistor connected between the control terminal of the second transistor and the second input node.

According to some embodiments, the control circuit may further include a tenth resistor connected between the control terminal of the third transistor and the second input node.

According to some embodiments, the second transistor may be an NPN transistor including a collector terminal and an emitter terminal respectively connected to both ends of the second resistor, and a base terminal being the control terminal of the second transistor. The third transistor may be an NPN transistor including a collector terminal connected to the control terminal of the second transistor, an emitter terminal connected to the second input node, and a base terminal being the control terminal of the third transistor.

According to some embodiments, the low voltage releaser may further include an eleventh resistor connected in series with the second transistor between both ends of the second resistor.

According to some embodiments, an inrush current limiter may further include a feedback controller connected between the first output node and the control terminal of the field effect transistor, and configured to decrease the voltage between the first input node and the control terminal of the field effect transistor based on an increase a current output to the first output node.

According to some embodiments, the feedback controller may include a second capacitor connected to the first output node, and a twelfth resistor connected between the second capacitor and the control terminal of the field effect transistor.

According to some embodiments, the field effect transistor is a metal oxide layer semiconductor the field effect transistor (MOSFET) including a source terminal connected to the first input node, a drain terminal connected to the first output node, and a gate terminal being the control terminal of the field effect transistor.

A system according to some embodiments may include an inrush current limiter that may include at least one of the features described above.

According to some embodiments of the present disclosure, it may be possible to provide an inrush current limiter having a relatively wide input voltage range.

DETAILED DESCRIPTION

Figure 1:
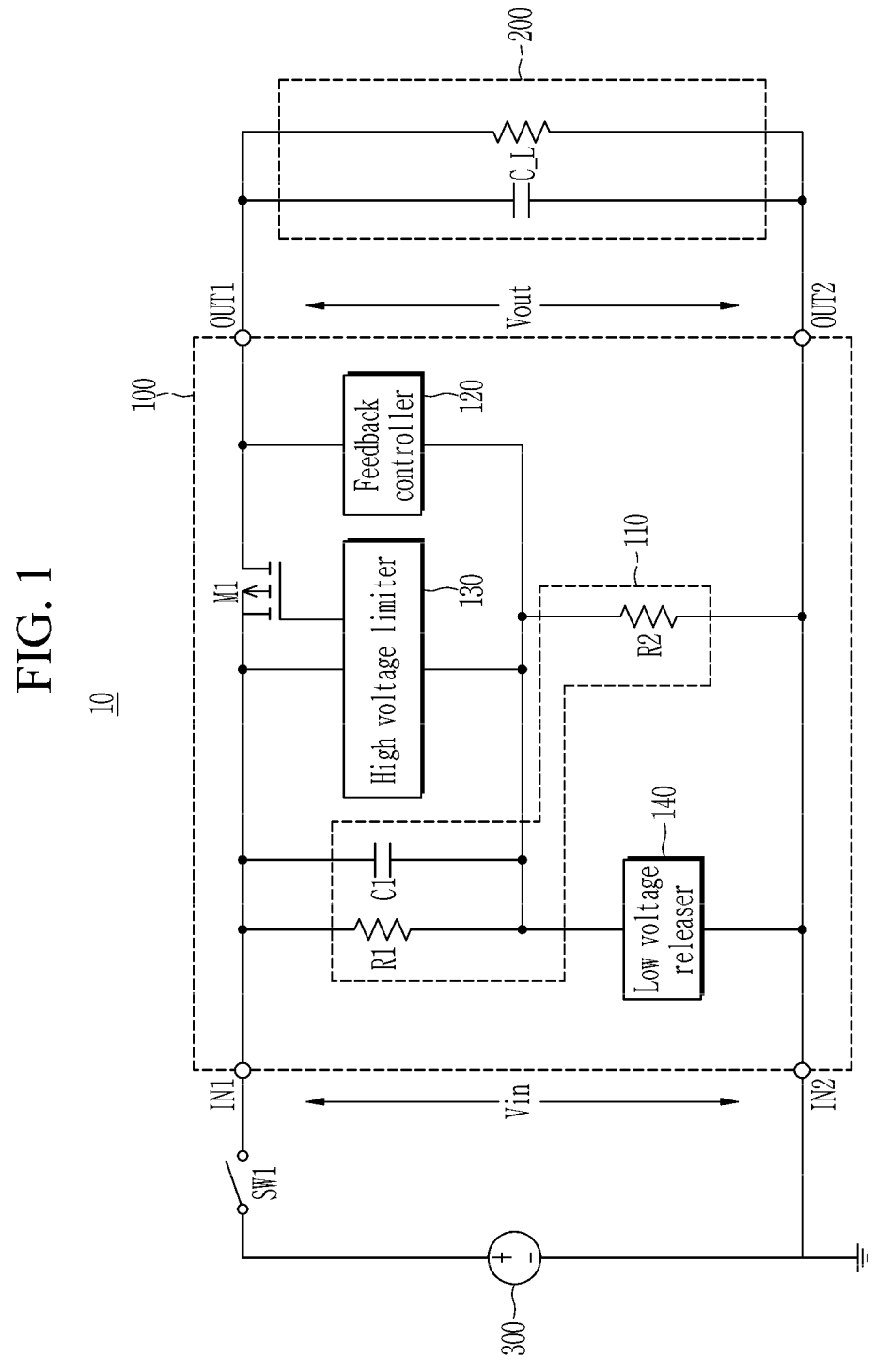
FIG. 1 schematically illustrate a system including an inrush current limiter according to some embodiments.

Aspects of some embodiments of the present invention will now be described in more detail with accompanying drawings. Effects and characteristics of embodiments, and a realization method thereof will now be described in detail with accompanying drawings. In the drawings, same reference numerals indicate same constituent elements, and no repeated descriptions thereof will be provided. As those skilled in the art would realize, the described embodiments may be modified in various different ways, all without departing from the spirit or scope of the present invention. The embodiments are provided as examples so that the present disclosure may be thorough and complete, and will sufficiently supply aspects and characteristics of the present invention to a person skilled in the art.

Hence, for the purpose of complete understanding on the aspects and the characteristics of the present invention, processes, factors, and skills that may not be needed by a person of ordinary skill in the art may not be described. In the drawings, relative sizes of elements, layers, and regions may be exaggerated for clarity.

In the present specification, the term "and/or" includes all or random combinations of a plurality of items that are related and arranged. When the embodiments of the present invention are described, the use of "can" or "may" signifies at least one embodiment of the present invention. Regarding the description on an embodiment of the present invention, a singular term may include a plural form unless stated in another way.

Terms including ordinal numbers such as "first", "second", and the like will be used only to describe various components, and are not to be interpreted as limiting these components. The terms are only used to differentiate one component from other components. For example, a first constituent element could be termed a second constituent element, and similarly, a second constituent element could be termed a first constituent element, without departing from the scope of the present invention.

It will be understood that when a constituent element or layer is referred to as being "on," "connected to," or "coupled to" another constituent element or layer, it can be directly on, connected to, or coupled to the other constituent element or layer, or one or more intervening constituent elements or layers may be present. In addition, it will also be understood that when a constituent element or layer is referred to as being "between" two constituent elements or layers, it can be the only constituent element or layer between the two constituent elements or layers, or one or more intervening constituent elements or layers may also be present.

Electrically connecting two constituent elements may include directly connecting two constituent elements, and connecting the same with another constituent element therebetween. The other constituent element may include a switch, a resistor, and a capacitor. When the embodiments are described, an expression of connection signifies electrical connection when an expression of direct connection is not provided.

Hereinafter, an inrush current limiter according to some embodiments of the present disclosure and a system including the same will be described in more detail with reference to the drawings.

FIG. 1 schematically illustrate a system including an inrush current limiter according to some embodiments. In addition, FIG. 2 illustrates an inrush current limiter according to some embodiments in further detail.

Figure 2:
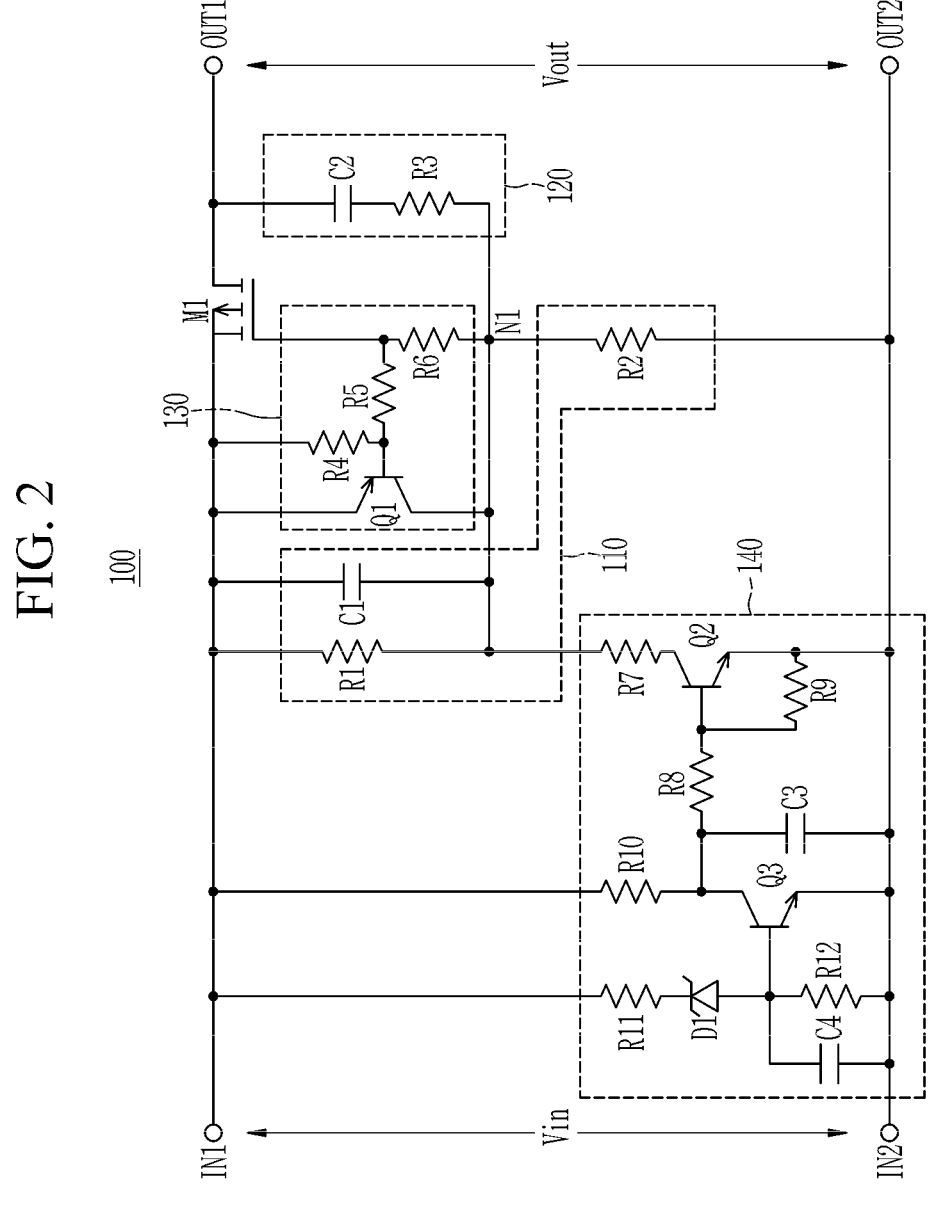
FIG. 2 illustrates an inrush current limiter according to some embodiments in further detail.

Referring to FIG. 1 and FIG. 2, a system 10 may include an inrush current limiter 100 electrically connected between a power source 300 and a load 200. The system 10 may be, for example, a vehicle system.

The power supply 300 may be electrically connected to input nodes IN1 and IN2 of the inrush current limiter 100 to supply the input voltage Vin to the inrush current limiter 100. For example, if the system 10 includes a high voltage battery pack, the power source 300 may be a high voltage battery pack. The load 200 is electrically connected to output nodes OUT1 and OUT2 of the inrush current limiter 100 to receive an output voltage Vout from the inrush current limiter 100.

The system 10 may further include a main switch SW1. Electrical connection of the power source 300 with the inrush current limiter 100 may be controlled by the main switch SW1.

The inrush current limiter 100 may include a transistor M1, a gate driver 110, a feedback controller 120, a high voltage limiter 130, and a low voltage releaser 140.

The transistor M1 includes first and second terminals connected to the input node IN1 and the output node OUT1, respectively, and may operate a switch that permits or block current flow between two nodes according to a voltage input to the control terminal. Referring to FIG. 1 as an example, the transistor M1 may be P-channel metal oxide layer semiconductor field effect transistor (P-channel MOSFET) having first and second terminals as a source terminal and a drain terminal, respectively, and the control terminal as a gate terminal. However, the embodiments according to the present disclosure are not limited thereto, and the transistor M1 may be an N-channel MOSFET. Hereinafter, for convenience of description, a case in which the transistor M1 is a P-channel MOSFET will be described as an example.

When a voltage is supplied from the power source 300, the gate driver 110 may control a gate voltage of the transistor M1 such that a voltage Vgs between the gate-source terminals of the transistor M1 (i.e., between the input node IN1 and the gate terminal of voltage of the transistor M1) may gradually increase. The gate driver 110 may include a capacitor C1 and a resistor R1 electrically connected in parallel between the input node IN1 (i.e., the source terminal of the transistor M1) and the gate terminal, and a resistor R2 connected between the gate terminal of the transistor M1 and an input node IN2.

When the main switch SW1 is turned on and the input voltage Vin is supplied from the power source 300, the current supplied from the power source 300 flows via the resistor R1 and the resistor R2, which are distribution resistors, and the capacitor C1 is charged by the supply voltage of the power source 300. Accordingly, the gate voltage Vg of the transistor M1 is gradually lowered by charging the capacitor C1, and the voltage Vgs between the gate-source terminals of the transistor M1 is gradually increased.

When the voltage Vgs between the gate-source terminals of the transistor M1 is low, it has a high resistance value, but as the gate-source voltage Vgs increases, the resistance value gradually decreases. Therefore, at the beginning of the power supply 300 connection, the voltage Vgs between the gate-source terminals of the transistor M1 gradually increases by the capacitor C1, and the inrush current may be limited due to the high on-resistance of the transistor M1. Then, when the voltage Vgs between the gate-source terminals exceeds a value (e.g., a preset value or threshold value) after a predetermined time has elapsed, the on-resistance of the transistor M1 converges to a minimum value such that the voltage drop by the transistor M1 may be minimized or reduced.

The feedback controller 120 is connected between an output terminal OUT1 (i.e., the drain terminal of the transistor M1) and the gate terminal, and when the current transmitted to the load 200 through the transistor M1 rises, perform a function of limiting the inrush current output to a capacitor C_L on the load 200 side by decreasing the voltage Vgs between the gate-source terminals of the transistor M1.

The feedback controller 120 may include a capacitor C2 and a resistor R3 electrically connected in series with each other between the drain terminal of the transistor M1 and the gate terminal. The capacitor C2 and the resistor R3 may decrease the voltage Vgs between the gate-source terminals of the transistor M1 by discharging the capacitor C1 when the inrush current rises. As a result, the on-resistance of the transistor M1 increases, such that an increase in inrush current output to the capacitor C_L on the load 200 side may be suppressed.

Figure 3A:
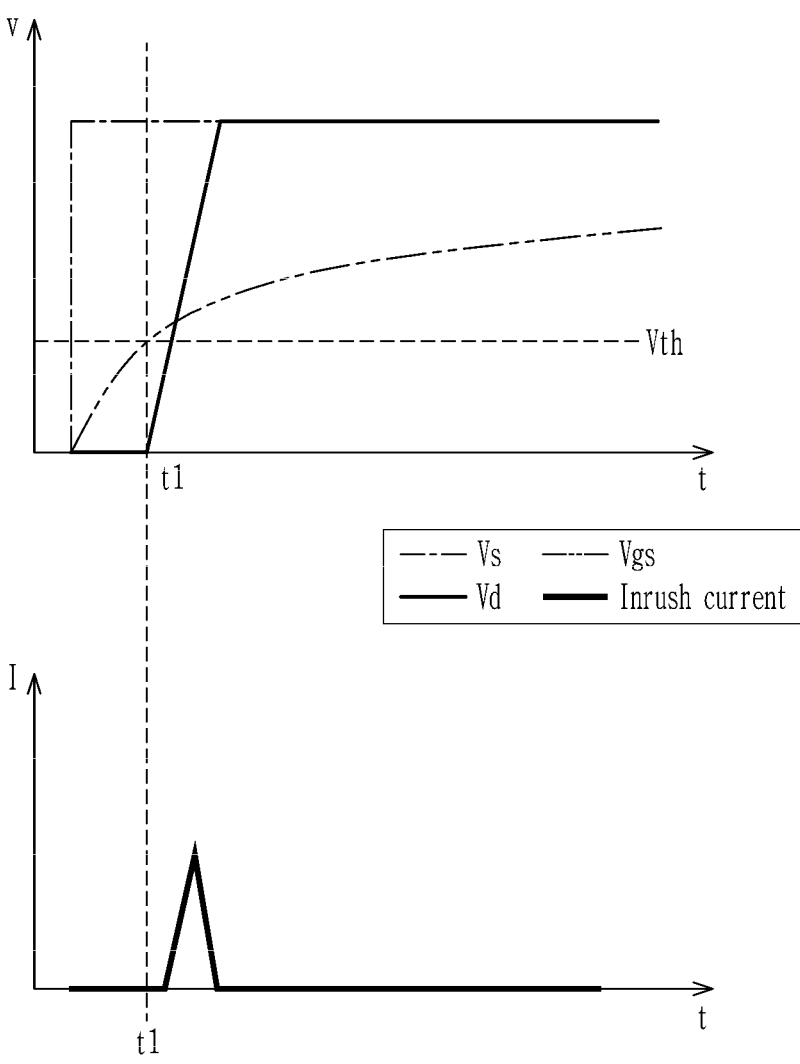
FIG. 3A and FIG. 3B are drawings for explaining an operation of a feedback controller according to some embodiments.
Figure 3B:
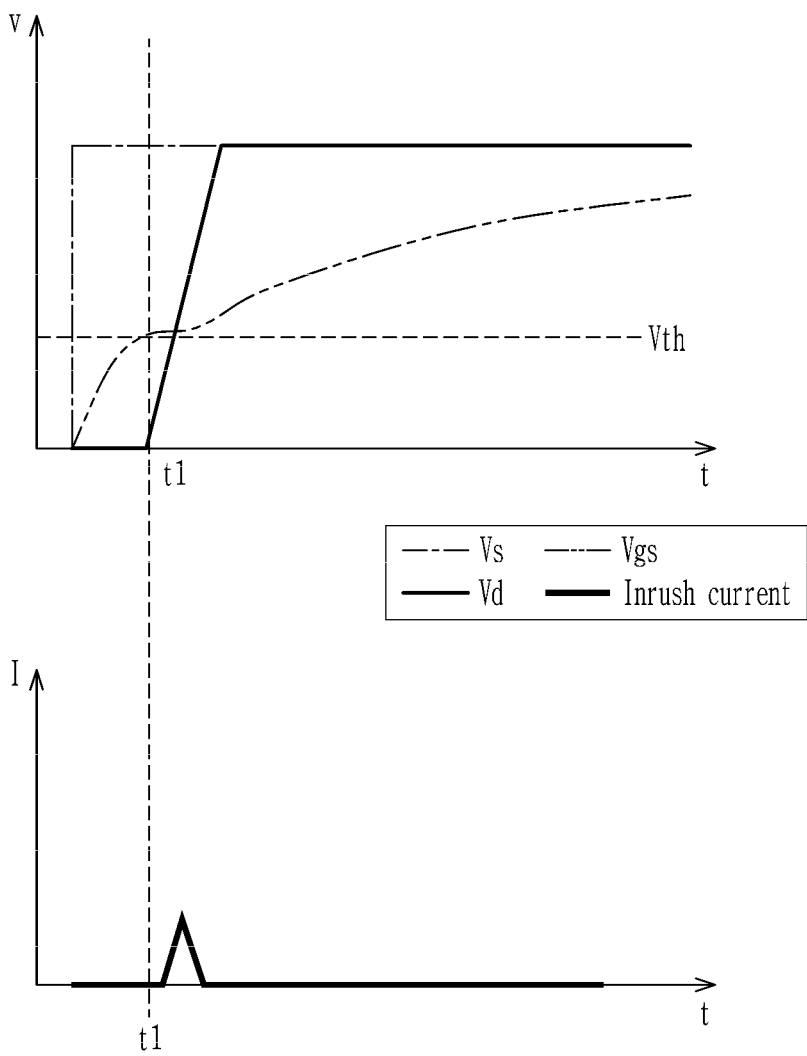

FIG. 3A and FIG. 3B are drawings for explaining an operation of a feedback controller according to some embodiments. FIG. 3A illustrates changes in a source voltage Vs of the transistor M1, the voltage Vgs between the gate-source terminals, and a drain voltage Vd, and the inrush current, when the feedback controller is omitted in the inrush current limiter, as an example. FIG. 3B illustrates changes in the source voltage Vs of the transistor M1, the voltage Vgs between the gate-source terminals, and the drain voltage Vd, and the inrush current, when the feedback controller is included in the inrush current limiter, as an example.

Referring to FIG. 3A and FIG. 3B, when the main switch SW1 is turned on and the voltage supply from the power supply 300 starts, the voltage Vs is applied to the source terminal of the transistor M1 and the voltage Vgs between the gate-source terminals of the transistor M1 gradually rises by the gate driver 110. Thereafter, when the voltage Vgs between the gate-source terminals of the transistor M1 becomes greater than or equal to a threshold voltage Vth at the time t1, the transistor M1 is turned on and the voltage Vd is applied to the drain terminal of the transistor M1, and as a result, an inrush current that is output to the capacitor C_L on the load 200 side is generated. When an inrush current occurs, the feedback controller 120 discharges the capacitor C1, and as shown in FIG. 3B, the voltage Vgs between the gate-source terminals of the transistor M1 is reduced, thereby limiting the inrush current.

Referring back to FIGS. 1 and 2, the high voltage limiter 130 may limit the rise of the voltage Vgs between the gate-source terminals of the transistor M1 by varying voltage distribution ratio of voltage divider circuits R1 and R2 of the gate driver 110 according to the voltage Vgs between the gate-source terminals of the transistor M1. The high voltage limiter 130 may include a transistor Q1 electrically connected in parallel with the resistor R1 and the capacitor C1 of the gate driver 110, and a resistance circuit varying an on-resistance of the transistor Q1.

The transistor Q1 includes first and second terminals respectively connected to both ends of the resistor R1 and the control terminal, the on-resistance may be varied according to a voltage applied to the control terminal. The resistance circuit is a voltage divider circuit and may vary voltage applied to the control terminal of the transistor Q1 according to the voltage Vgs between the gate-source terminals of the transistor M1. The resistance circuit may include a resistor R4 connected between the source terminal of the transistor M1 and the control terminal (for example, base terminal) of the transistor Q1 and a resistor R5 connected between the control terminal of the transistor Q1 and the gate terminal of the transistor M1. Accordingly, the voltage Vgs between the gate-source terminals of the transistor M1 may be distributed by the resistors R4 and R5 and applied to the control terminal of the transistor Q1.

The transistor Q1 may be a PNP transistor in which the control terminal is a base terminal, and first and second terminals are an emitter terminal and a collector terminal, respectively. Accordingly, as the voltage Vgs between the gate-source terminals of the transistor M1 increases and a voltage between the emitter-base terminals of the transistor Q1 increases, the on-resistance of the transistor Q1 may decrease. The on-resistance of the transistor Q1 may be electrically connected in parallel between the source terminal and the gate terminal of the transistor M1 together with the resistor R1 of the gate driver 110. Accordingly, as the on-resistance of the transistor Q1 decreases, a resistance value connected between the source terminal and the gate terminal of the transistor M1 may decrease. As the value of the resistance connected between the source terminal and the gate terminal of the transistor M1 decreases, the voltage distribution ratio corresponding to the resistor R1 of the gate driver 110 decreases, and thus, the voltage Vgs between the gate and the source terminal of the transistor M1 may decrease.

As such, when the voltage Vgs between the gate-source terminals of the transistor M1 increases, the high voltage limiter 130 may limit the voltage Vgs between the gate-source terminals of the transistor M1 by adjusting the voltage distribution ratio of the voltage divider circuits R1 and R2 of the gate driver 110.

Figure 4:
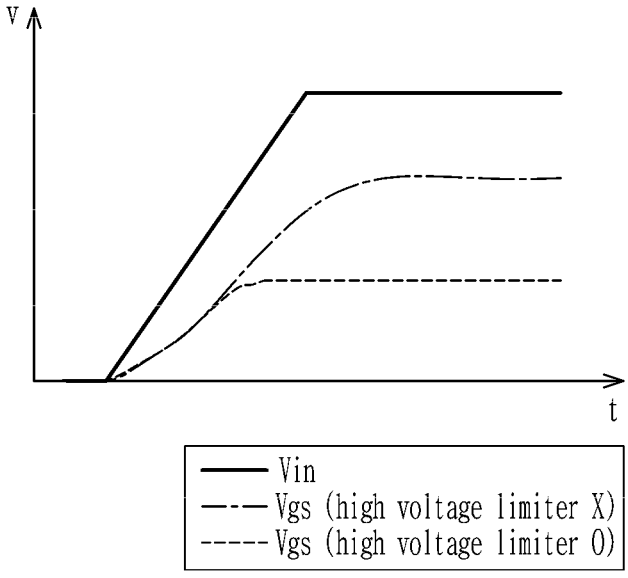
FIG. 4 is a drawing for explaining an operation of a high voltage limiter according to some embodiments.

FIG. 4 is a drawing for explaining an operation of a high voltage limiter according to some embodiments.

Referring to FIG. 4, when the main switch SW1 is turned-on and the supply of the voltage Vin from the power source 300 starts, the voltage Vgs between the gate-source terminals of the transistor M1 gradually rises. When the voltage Vgs between the gate-source terminals of the transistor M1 exceeds a value (e.g., a preset value or threshold value), the transistor Q1 of the high voltage limiter 130 is turned-on, and limits the rise of the voltage Vgs between the gate-source terminals of the transistor M1. Accordingly, the voltage Vgs between the gate-source terminals of the transistor M1 may be maintained at a lower voltage than when the high voltage limiter 130 is not present.

Referring again to FIG. 1 and FIG. 2, the resistance circuit of the high voltage limiter 130 may include a resistor R6 connected between the gate terminal of the transistor M1 and a node N1. In this case, resistors R1 and R2 and the capacitor C1 of the gate driver 110, and the resistor R3 of the feedback controller 120 may be connected to the gate terminal of the transistor M1 through the node N1 and the resistor R6. Therefore, the voltage Vgs between the gate-source terminals of the transistor M1 may be a voltage obtained by dividing the voltage across the resistor R1 through the resistor circuits R4, R5, and R6.

The low voltage releaser 140 may vary the voltage distribution ratio of the voltage divider circuits R1 and R2 of the gate driver 110 according to the input voltage Vin, such that the voltage drop due to the transistor M1 may be minimized or reduced even at the input voltage Vin lower than a value (e.g., a preset value or threshold value). The low voltage releaser 140 may include a transistor Q2 connected in parallel with the resistor R2 of the gate driver 110 and the control circuit that controls turning on/off of the transistor Q2. The control circuit may include a transistor Q3 connected between the control terminal of the transistor Q2 and the input node IN2 and controlling the turning on/off of the transistor Q2 according to the input voltage Vin, and a Zener diode D1 connected between the input node IN1 and the control terminal of the transistor Q3 and controlling the turning on/off of the transistor Q2 according to the input voltage Vin.

The Zener diode D1 may include a cathode connected to the input node IN1 and an anode connected to the control terminal of the transistor Q3. The Zener diode D1 is conducted when the input voltage Vin is higher than a value (e.g., a preset value or threshold value), and the input voltage Vin may be transferred to the control terminal of the transistor Q3.

The transistor Q3 may include first terminal connected to the control terminal of the transistor Q2, second terminal connected to the input node IN2, and the control terminal connected to an anode of the Zener diode D1. The transistor Q2 may be turned on or off depending on whether the Zener diode D1 is conducting. The transistor Q3 may operate as a switch that connects the control terminal of the transistor Q2 and the input node IN2 when turned on and cuts off the electrical connection between the control terminal of the transistor Q2 and the input node IN2 when turned off.

The transistor Q3 may be an NPN transistor in which the control terminal is a base terminal, and a first terminal and a second terminal are a collector terminal and an emitter terminal, respectively. Accordingly, the transistor Q3 may be turned on when a voltage higher than a value (e.g., a preset value or threshold value) is applied to the base terminal. That is, when a voltage higher than a value (e.g., a preset value or threshold value) is applied from the power supply 300 and the Zener diode D1 conducts, a voltage higher than the value (e.g., a preset value or threshold value) is applied to the base terminal of the transistor Q3 through the Zener diode D1, and the transistor Q3 may be turned on On the other hand, when a voltage less than a value (e.g., a preset value or threshold value) is applied from the power source 300 and the Zener diode D1 becomes non-conductive, the transistor Q3 may be turned off.

The low voltage releaser 140 may further include, for stable operation of the transistor Q3, the resistor R11 connected between the input node IN1 and a cathode of the Zener diode D1, and the resistor R12 and a capacitor C4 connected in parallel between the base terminal of the transistor Q3 and the input node IN2.

The transistor Q2 may include first and second terminals respectively connected to both ends of the resistor R2 and a control terminal. A voltage input to the control terminal of the transistor Q2 may vary depending on whether the transistor Q3 is turned on. That is, the transistor Q2 may operate as a switch that is turned on or off depending on whether the transistor Q3 is turned on. When the transistor Q3 is turned on, the control terminal of the transistor Q2 may be connected to the input node IN2. When the transistor Q3 is turned off, a voltage divided from the input voltage Vin by the resistors R10, R8, and R9 may be input to the control terminal of the transistor Q2.

The transistor Q3 may be an NPN transistor in which the control terminal is a base terminal, and a first terminal and a second terminal are a collector terminal and an emitter terminal, respectively. Therefore, the transistor Q2 may be turned on when a voltage higher than a value (e.g., a preset value or threshold value) is applied to the base terminal. That is, when the transistor Q3 is turned on and the control terminal of the transistor Q2 is connected to the input node IN2, the transistor Q3 may be turned off. On the other hand, when the transistor Q3 is turned off, a voltage of the control terminal of the transistor Q2 is increased by the input voltage Vin, and the transistor Q2 may be turned on.

The transistor Q2 is connected in series with the resistor R7, and the series combination of the transistor Q2 and the resistor R7 may be connected in parallel with the resistor R2 of the gate driver 110. Therefore, when the transistor Q2 is turned on, the resistor R2 and the resistor R7 of the gate driver 110 are connected in parallel, and accordingly, the voltage distribution ratio according to the resistors R1 and R2 of the gate driver 110 may be varied. That is, when the transistor Q2 is turned on, a resistance value between the gate terminal of the transistor M1 and the input node IN2 decreases, and as a result, the voltage distribution ratio corresponding to the resistor R1 of the gate driver 110 increases, such that a difference between the input voltage Vin and the voltage Vgs between the gate-source terminals of the transistor M1 may be reduced.

The low voltage releaser 140 may further include, for a stable operation of the transistor Q2, the resistor R10 connected between the input node IN1 and a first terminal of the transistor Q3, a resistor R8 connected between the first terminal of the transistor Q3 and the control terminal of the transistor Q2, a resistor R9 connected between the control terminal of the transistor Q2 and second terminal, and a capacitor C8 connected between the first terminal of the transistor Q3 and the input node IN2.

Meanwhile, the resistor R7 connected between the first terminal of the transistor Q2 and the resistor R1 in the low voltage releaser 140 may be omitted. In this case, when the transistor Q2 is turned on, the resistance value between the gate terminal of the transistor M1 and the input node IN2 further decreases, and accordingly, the voltage distribution ratio corresponding to the resistor R1 of the gate driver 110 may further increase.

As described above, when the input voltage Vin becomes lower than a value (e.g., a preset value or threshold value), the low voltage releaser 140 may turn on the transistor Q2 to decrease the resistance value of resistor connected between the gate terminal of the transistor M1 and the input node IN2. Accordingly, a voltage drop due to the voltage distribution of the gate driver 110 may decrease, and thus a difference between the input voltage Vin and the voltage Vgs between the gate-source terminals of the transistor M1 may decrease.

Figure 5:
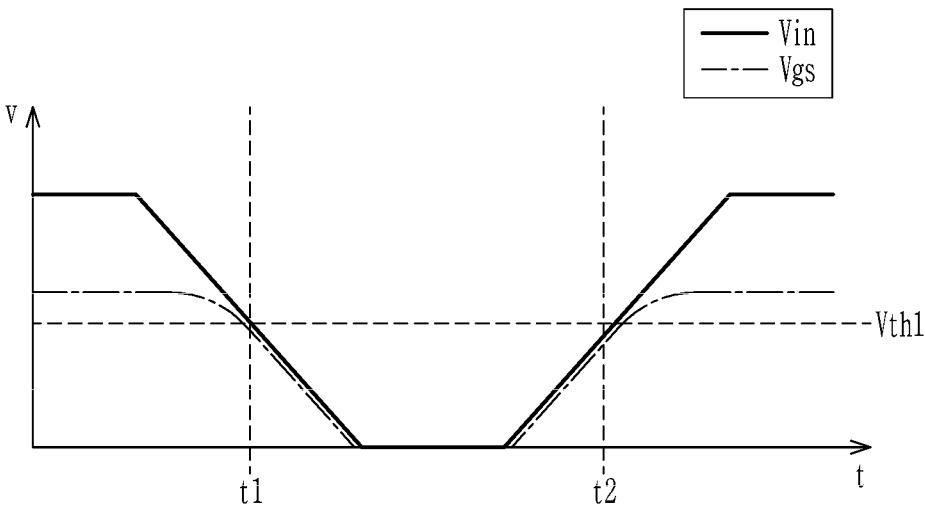
FIG. 5 is a drawing for explaining an operation of a low voltage releaser according to some embodiments.

FIG. 5 is a drawing for explaining an operation of a low voltage releaser according to some embodiments.

Referring to FIG. 5, when the input voltage Vin becomes lower than a conduction voltage Vth1 of the Zener diode D1 at a time point t1, the transistor Q2 of the low voltage releaser 140 may be turned on. Accordingly, the voltage drop due to the resistance between the gate terminal of the transistor M1 and the input node IN2 is decreased such that the voltage Vgs between the gate and source terminal of the transistor M1 may be very small compared to the input voltage Vin. Thereafter, when the input voltage Vin becomes higher than the conduction voltage Vth1 of the Zener diode D1 at the time t2, the transistor Q2 of the low voltage releaser 140 may be turned off. Accordingly, only the resistor R2 is connected between the gate terminal of the transistor M1 and the input node IN2, such that the voltage drop due to the resistor between the gate terminal of the transistor M1 and the input node IN2 increases, and the voltage difference between the voltage Vgs between the gate-source terminals of the transistor M1 and the input voltage Vin may be increased.

As described above, in the inrush current limiter 100 according to some embodiments, when the input voltage Vin is high, the transistor M1 may be protected by limiting the increase of the voltage Vgs between the gate-source terminals of the transistor M1 by using the high voltage limiter 130. In addition, when the input voltage Vin is low, the inrush current limiter 100 minimizes the voltage drop of the voltage Vgs between the gate-source terminals of the transistor M1 by the gate driver 110, thereby ensuring stable operation of the transistor M1. As such, the inrush current limiter 100 may stably operate in a wide range of the input voltage, and when applied to the system 10, it may be applied without needing to change a circuit according to the specifications of the power source 300. In addition, by configuring the high voltage limiter 130 and the low voltage releaser 140 using low-cost passive devices, the inrush current limiter 100 may be miniaturized or reduced and cost increase may be minimized or controlled.

Electronic or electrical devices according to embodiments of the present invention and/or other related devices or constituent elements may be realized by using appropriate hardware, firmware (e.g., an application-specific integrated circuit), software, or combinations of software, firmware, and hardware. For example, various configurations of the above-noted devices may be positioned on one integrated circuit (IC) chip or an individual IC chip. In addition, various configurations of the above-noted devices may be realized on a flexible printed circuit film, a tape carrier package (TCP), a printed circuit board (PCB), or one substrate. The electrical or mutual connections described in the present specification may, for example, be realized by the PCB, wires on different types of circuit carriers, or conductive elements. The conductive elements may, for example, include metallization such as surface metallizations and/or pins, and may include conductive polymers or ceramics. Further, electrical energy may be transmitted by electromagnetic radiation or a light-using radio access.

In addition, the various configurations of the devices may be performed by at least one processor so as to perform the above-described various functions, they may be performed in at least one computing device, and they may be processes or threads for performing computer program instructions and interacting with other system constituent elements. The computer program instruction is stored in a memory realizable in a computing device using a standard memory device such as a random access memory (RAM). The computer program instruction may also be stored in a non-transitory computer readable medium such as a CD-ROM or a flash drive.

Further, a person of ordinary skill in the art must understand that various functions of the computing device may be combined or united to a single computing device, or functions of a specific computing device may be dispersed to at least another computing device while not digressing from the range of the embodiments of the present invention.

DESCRIPTION OF SOME OF THE REFERENCE SYMBOLS

10: system
100: inrush current limiter
110: gate driver
120: feedback controller
130: high voltage limiter
140: low voltage releaser
200: load
300: power source
SW1: main switch
M1: transistor
IN1, IN2: input node
OUT1, OUT2: output node
What is claimed is:

1. An inrush current limiter, comprising:
first and second input nodes configured to receive an input voltage from a power source;
first and second output nodes configured to be connected to a load;
a field effect transistor connected between the first input node and the first output node;
a gate driver comprising a first voltage divider circuit comprising a first resistor connected between the first input node and a control terminal of the field effect transistor and a second resistor connected between the control terminal of the field effect transistor and the second input node, and a first capacitor connected between the first input node and the control terminal of the field effect transistor, and configured to adjust a time until the field effect transistor is turned-on after the input voltage is input;

a high voltage limiter comprising:

a third resistor connected in parallel with the first resistor and having a resistance value varied according to a voltage between the first input node and the control terminal of the field effect transistor, and configured to limit a voltage rise between the first input node and the control terminal of the field effect transistor by varying resistance value of the third resistor;

a first transistor connected between the first input node and the control terminal of the field effect transistor; and a second voltage divider circuit configured to vary voltage applied to a control terminal of the first transistor according to the voltage between the first input node and the control terminal of the field effect transistor, the second voltage divider circuit comprising a fourth resistor connected between the first input node and the control terminal of the first transistor; and a fifth resistor connected between the control terminal of the first transistor and the control terminal of the field effect transistor, wherein the third resistor is an on-resistance of the first transistor; and a low voltage releaser comprising:

a seventh resistor having one end connected to the control terminal of the field effect transistor;

a second transistor connected in series with the seventh resistor between the control terminal of the field effect transistor and the second input node; and a control circuit configured to turn on the second transistor if the input voltage becomes lower than a preset value, wherein, if the second transistor is turned on, the seventh resistor and the second resistor are connected in parallel between the control terminal of the field effect transistor and the second input node.

2. The inrush current limiter as claimed in claim 1, wherein:

the second voltage divider circuit further comprises a sixth resistor connected to the control terminal of the field effect transistor; and the first resistor, the second resistor, the first capacitor, and the first transistor are connected to the control terminal of the field effect transistor through the sixth resistor.

3. The inrush current limiter as claimed in claim 1, wherein the first transistor is an PNP transistor comprising an emitter terminal connected to the first input node, a collector terminal connected to the control terminal of the field effect transistor, and a base terminal operating as the control terminal of the first transistor.

4. The inrush current limiter as claimed in claim 1, wherein, if the seventh resistor and the second resistor are connected in parallel between the control terminal of the field effect transistor and the second input node, a voltage distribution ratio corresponding to the first resistor increases while a voltage distribution ratio corresponding to the second resistor decreases.

5. The inrush current limiter as claimed in claim 1, wherein the low voltage releaser further comprises an eleventh resistor connected in series with the second transistor between both ends of the second resistor.

6. The inrush current limiter as claimed in claim 1, further comprising a feedback controller connected between the first output node and the control terminal of the field effect transistor, and configured to decrease the voltage between the first input node and the control terminal of the field effect transistor based on the current being output to the first output node.

7. The inrush current limiter as claimed in claim 6, wherein the feedback controller comprises:

a second capacitor connected to the first output node; and a twelfth resistor connected between the second capacitor and the control terminal of the field effect transistor.

8. The inrush current limiter as claimed in claim 1, wherein the field effect transistor is a metal oxide layer semiconductor the field effect transistor (MOSFET) comprising a source terminal connected to the first input node, a drain terminal connected to the first output node, and a gate terminal being the control terminal of the field effect transistor.

9. A system comprising an inrush current limiter according to claim 1.

10. An inrush current limiter, comprising:

first and second input nodes configured to receive an input voltage from a power source;

first and second output nodes configured to be connected to a load;

a field effect transistor connected between the first input node and the first output node;

a gate driver comprising a first voltage divider circuit comprising a first resistor connected between the first input node and a control terminal of the field effect transistor and a second resistor connected between the control terminal of the field effect transistor and the second input node, and a first capacitor connected between the first input node and the control terminal of the field effect transistor, and configured to adjust a time until the field effect transistor is turned-on after the input voltage is input;

a high voltage limiter comprising a third resistor connected in parallel with the first resistor and having a resistance value varied according to a voltage between the first input node and the control terminal of the field effect transistor, and configured to limit a voltage rise between the first input node and the control terminal of the field effect transistor by varying resistance value of the third resistor;

a low voltage releaser in which the first voltage divider circuit is configured to increase a voltage distribution ratio corresponding to the first resistor based on the input voltage becoming lower than a preset value, wherein the low voltage releaser comprises:

a second transistor connected in parallel with the second resistor; and a control circuit configured to turn on the second transistor based on the input voltage becoming lower than the preset value, wherein the control circuit comprises:

a third transistor connected between a control terminal of the second transistor and the second input node; and a Zener diode that is connected between the first input node and a control terminal of the third transistor and is configured to conduct based on the input voltage exceeding the preset value, wherein the third transistor is configured to be turned on based on the Zener diode conducting, and wherein the second transistor is configured to be turned-on based on the third transistor being turned off.

11. The inrush current limiter as claimed in claim 10, wherein the control circuit further comprises:

a seventh resistor connected between the first input node and the third transistor;

an eighth resistor connected between the third transistor and the control terminal of the second transistor; and a ninth resistor connected between the control terminal of the second transistor and the second input node.

12. The inrush current limiter as claimed in claim 10, wherein the control circuit further comprises a tenth resistor connected between the control terminal of the third transistor and the second input node.

13. The inrush current limiter as claimed in claim 10, wherein:

the second transistor is an NPN transistor comprising a collector terminal and an emitter terminal respectively connected to both ends of the second resistor, and a base terminal being the control terminal of the second transistor; and the third transistor is an NPN transistor comprising a collector terminal connected to the control terminal of the second transistor, an emitter terminal connected to the second input node, and a base terminal being the control terminal of the third transistor.

* * * * *